(12) United States Patent
Eisele et al.

(10) Patent No.: US 9,368,529 B2
(45) Date of Patent: Jun. 14, 2016

(54) OPTICAL SHIELDING DEVICE FOR SEPARATING OPTICAL PATHS

(75) Inventors: Andreas Eisele, Leinfelden-Echterdingen (DE); Oliver Wolst, Singapore (SG); Uwe Skultety-Betz, Leinfelden-Echterdingen (DE); Bernd Schmidtke, Leonberg (DE)

(73) Assignee: Robert Bosch GmbH, Stuttgart (DE)

( * ) Notice: Subject to any disclaimer, the term of this patent is extended or adjusted under 35 U.S.C. 154(b) by 463 days.

(21) Appl. No.: 13/877,217

(22) PCT Filed: Aug. 8, 2011

(86) PCT No.: PCT/EP2011/063620
§ 371 (c)(1),
(2), (4) Date: Jul. 1, 2013

(87) PCT Pub. No.: WO2012/045503
PCT Pub. Date: Apr. 12, 2012

(65) Prior Publication Data
US 2013/0265590 A1   Oct. 10, 2013

(30) Foreign Application Priority Data
Oct. 4, 2010  (DE) .................... 10 2010 041 937

(51) Int. Cl.
*H01J 5/02*   (2006.01)
*H01L 27/146*   (2006.01)
(Continued)

(52) U.S. Cl.
CPC .......... *H01L 27/14618* (2013.01); *G01B 11/02* (2013.01); *G01J 1/06* (2013.01); *G01S 7/4816* (2013.01); *G01S 7/497* (2013.01); *G01S 17/08* (2013.01)

(58) Field of Classification Search
CPC ... G01B 11/02; H05K 5/0013; H05K 5/0021; G01S 7/4816; G01S 7/497; G01S 17/08; G01J 1/04; G01J 1/06; G01J 2001/061; H01L 31/0203; H01L 27/14618; H01L 31/0232; H01L 27/14625; H01L 27/14623; H01L 27/14685; H01L 31/02325; H04N 5/2252; H04N 5/2253; F16L 21/02; B65D 53/02; B65D 53/06

USPC .............. 250/239, 237 R, 551; 257/678, 680, 257/433–435; 438/64–67, 106, 116, 117; 220/528, 536, 221, 240, 651–653, 662, 220/720

See application file for complete search history.

(56) References Cited

U.S. PATENT DOCUMENTS 5,210,406 A * 5/1993 Beran et al. ................... 250/221
5,798,831 A   8/1998 Hagiwara
(Continued)

FOREIGN PATENT DOCUMENTS

CN   1770211 A    5/2006
CN   101078771 A   11/2007
(Continued)

OTHER PUBLICATIONS

International Search Report corresponding to PCT Application No. PCT/EP2011/063620, mailed Dec. 13, 2011 (German and English language document) (5 pages).

*Primary Examiner* — Thanh Luu
(74) *Attorney, Agent, or Firm* — Maginot, Moore & Beck LLP

(57) ABSTRACT

A sensor unit for detecting reference and measurement radiation for a distance measurement device has a sensor element and an optical shielding device. The sensor element has a first detection region for detecting measurement radiation and a second detection region for detecting reference radiation. The optical shielding device is positioned in relation to the sensor element and fastened, and the optical shielding device optically separates the first and second detection regions from each other. The optical shielding device further comprises a first recess and a second recess which are permeable to optical radiation of a first wavelength range.

13 Claims, 10 Drawing Sheets

(51) Int. Cl.
*G01J 1/06* (2006.01)
*G01S 7/481* (2006.01)
*G01B 11/02* (2006.01)
*G01S 7/497* (2006.01)
*G01S 17/08* (2006.01)

(56) References Cited

U.S. PATENT DOCUMENTS 6,642,998 B2 * 11/2003 Nakagawa .............. G01C 3/08
356/3.08
7,046,344 B2 * 5/2006 Yamamoto et al. .......... 356/4.01
8,704,152 B2 * 4/2014 Svajda et al. ................. 250/221
2007/0272882 A1 11/2007 Ishihara et al.
2009/0002505 A1 * 1/2009 Imada .................... H04N 9/093
348/218.1

FOREIGN PATENT DOCUMENTS

| | | |
|---|---|---|
| CN | 101563591 A | 10/2009 |
| DE | 10 2005 037 253 A1 | 2/2007 |
| EP | 1 619 469 A1 | 1/2006 |
| GB | 2 122 835 A | 1/1984 |

* cited by examiner

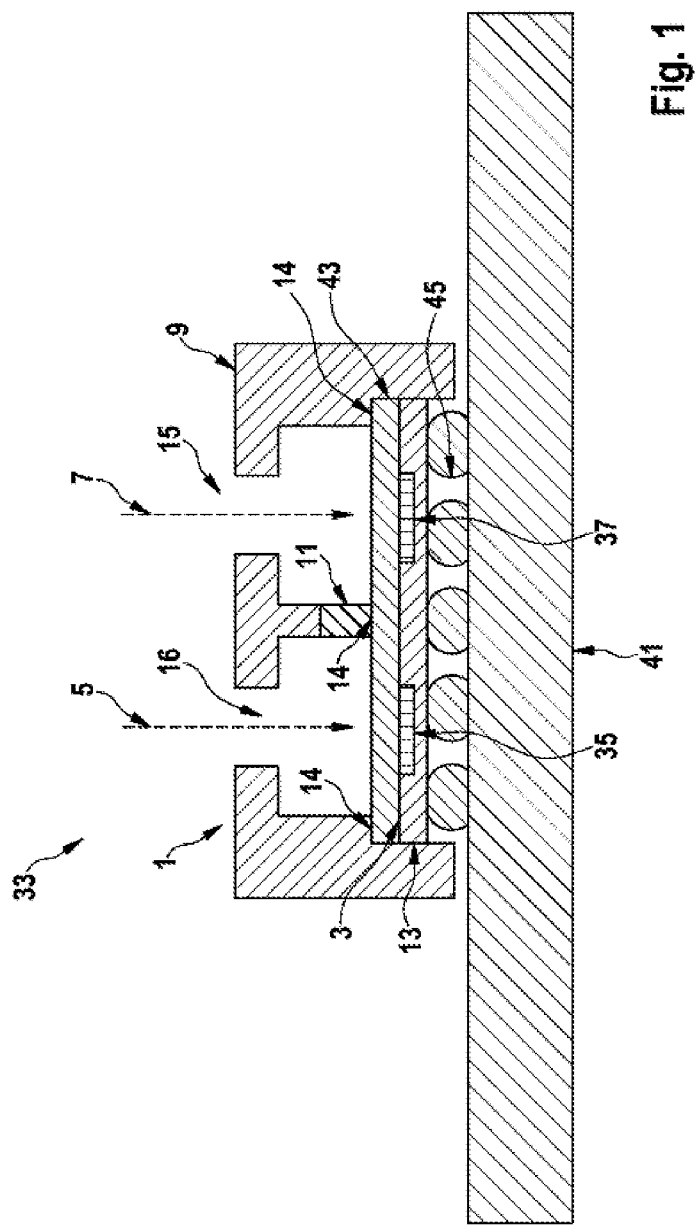

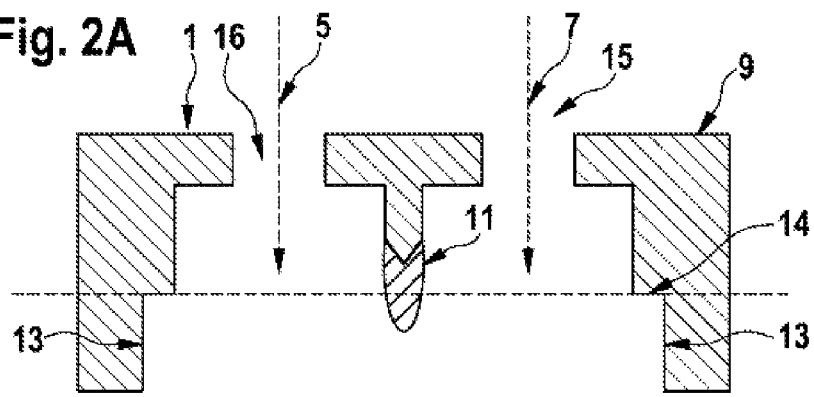
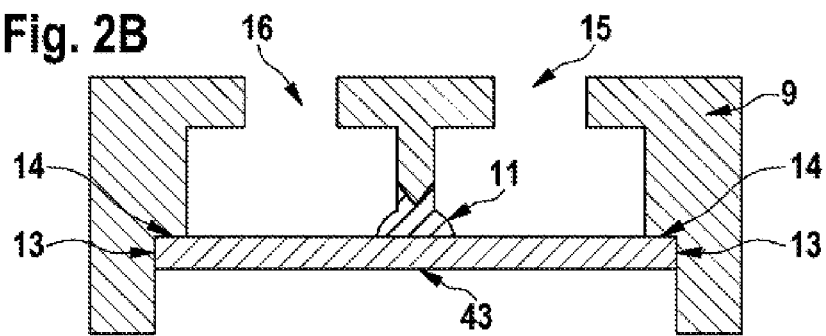
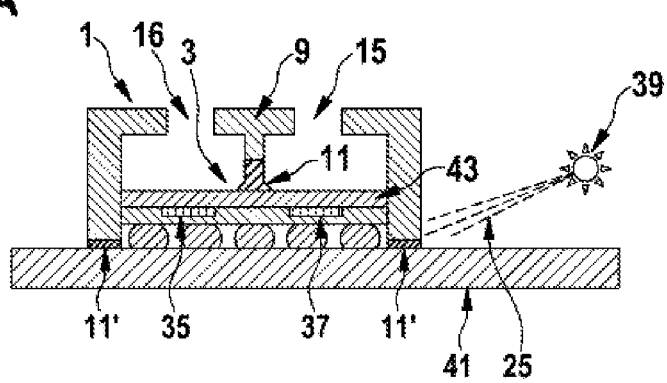

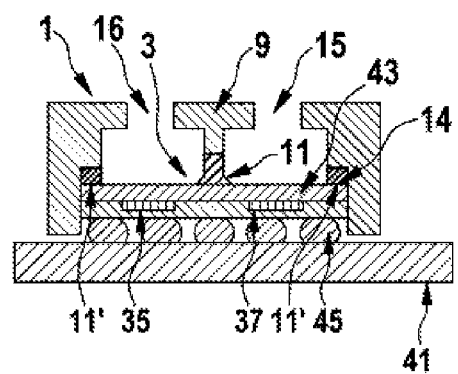
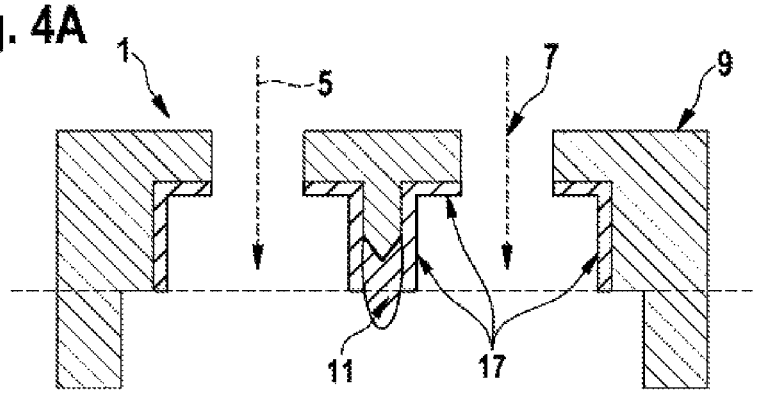
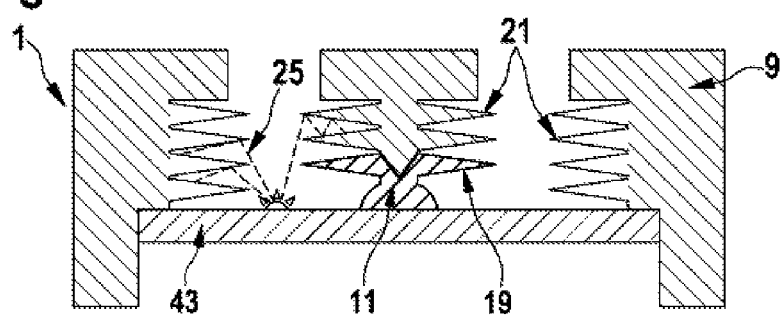

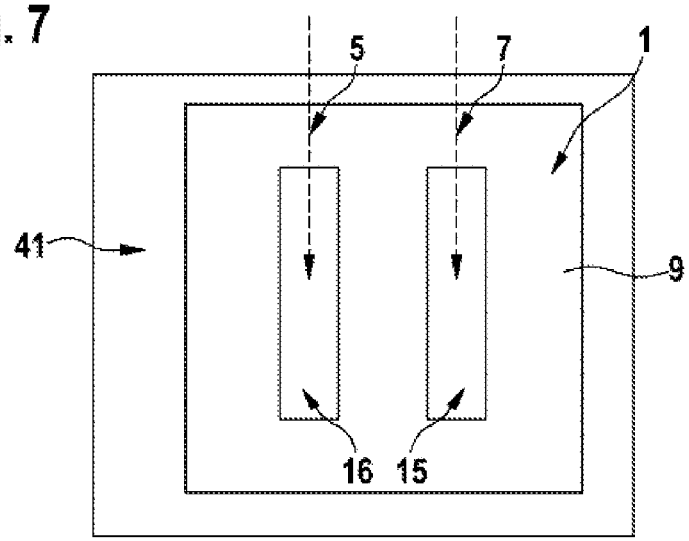
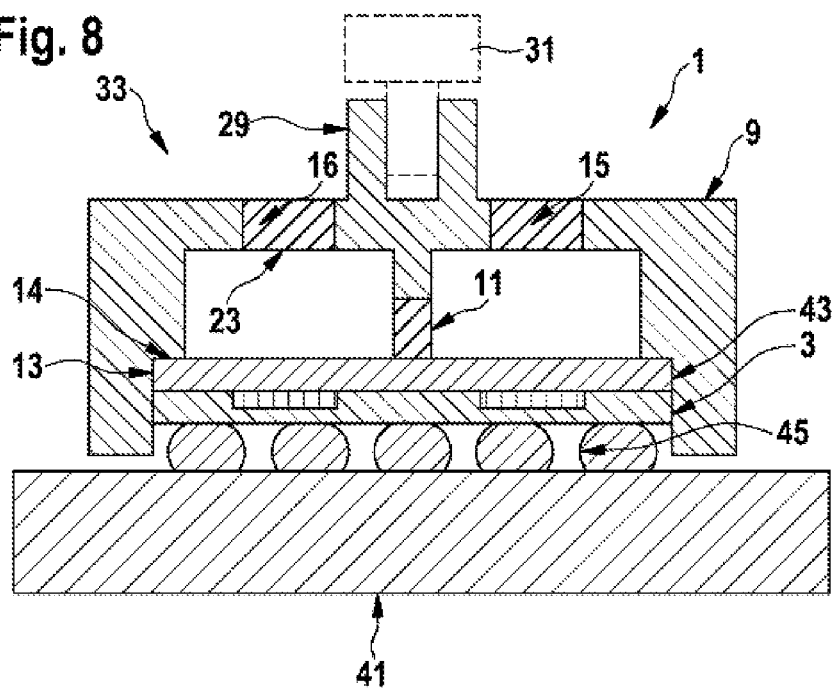

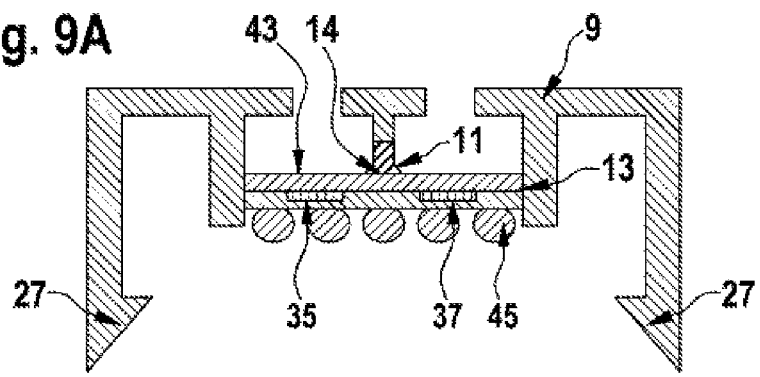
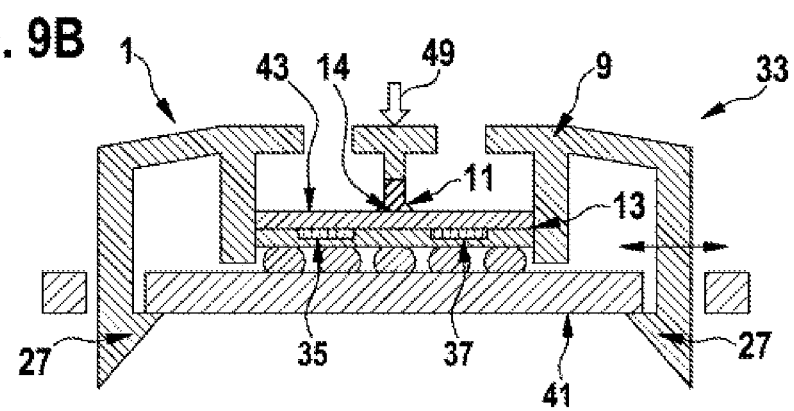
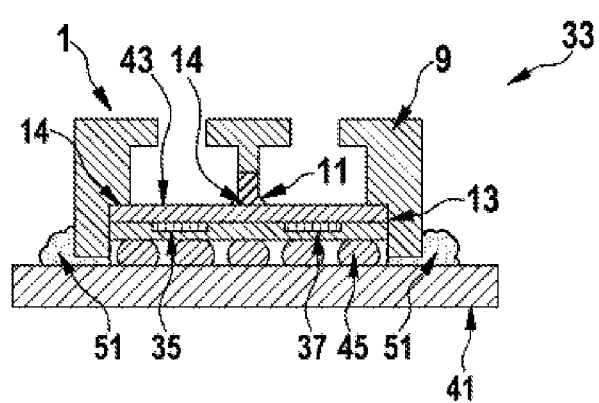

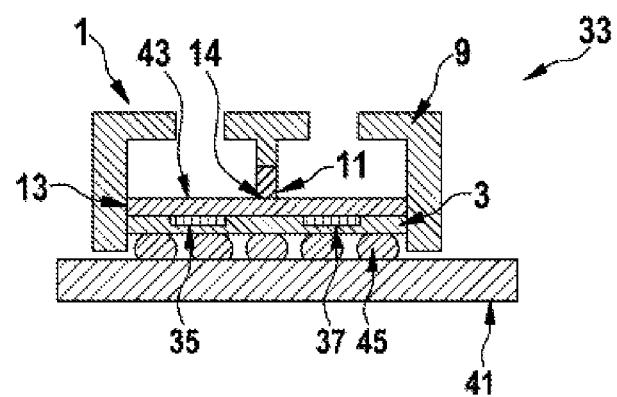
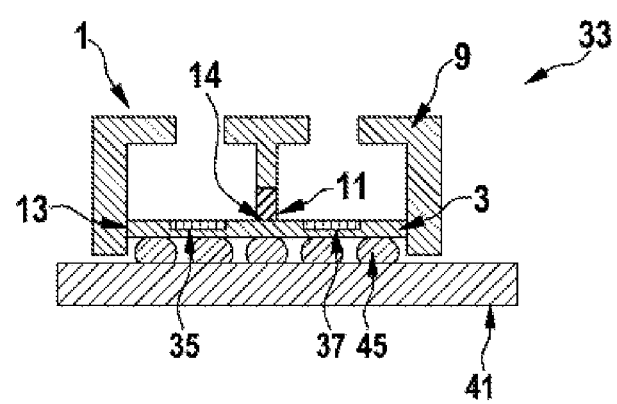
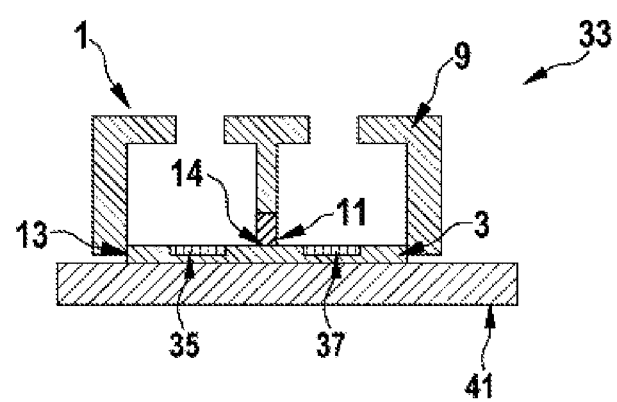

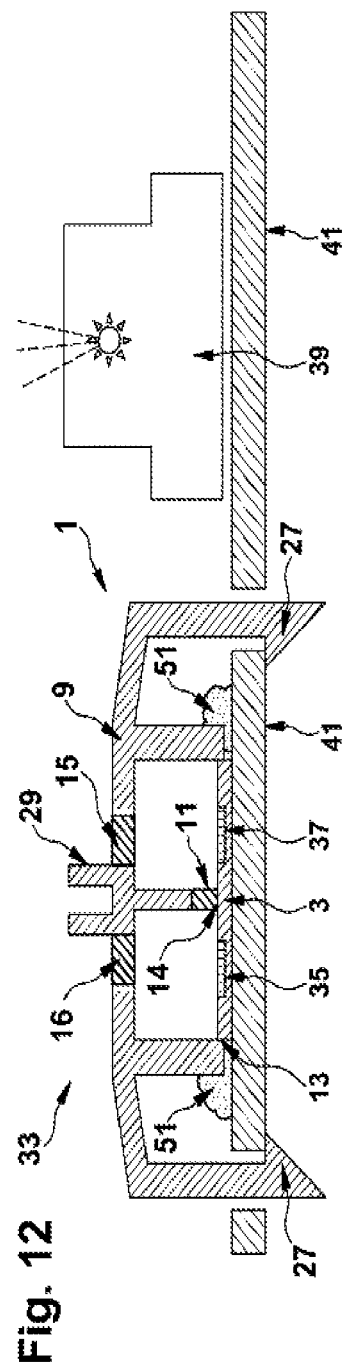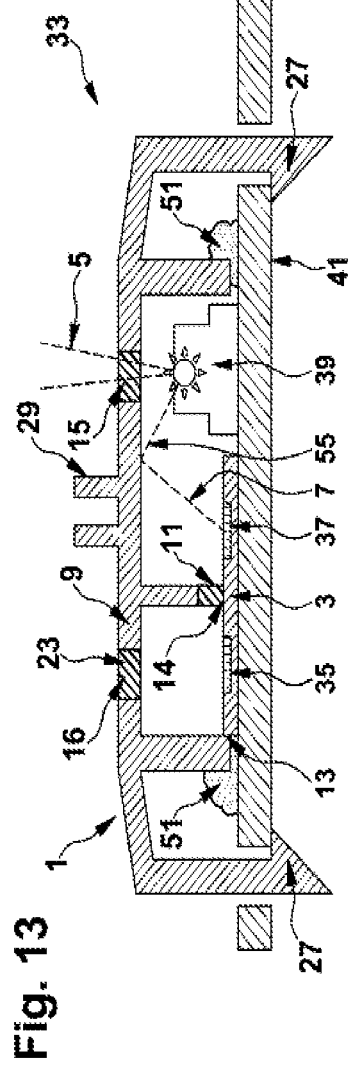

OPTICAL SHIELDING DEVICE FOR SEPARATING OPTICAL PATHS

This application is a 35 U.S.C. §371 National Stage Application of PCT/EP2011/063620, filed on Aug. 8, 2011, which claims the benefit of priority to Serial No. DE 10 2010 041 937.0 filed on Oct. 4, 2010 in Germany, the disclosures of which are incorporated herein by reference in their entirety.

BACKGROUND

In optical measuring apparatuses it may often be important to carry out a reference measurement in relation to an actual measurement. The reference measurement can be used for the purpose of calibrating the measuring apparatus.

By way of example, apparatus-internal reference sections can be provided for carrying out the reference measurement. DE 10 2005 037 253 A1 discloses e.g. a distance measuring apparatus with a reference section.

The reference measurement can be carried out before, after or simultaneously with the actual measurement. In the case of simultaneous measurement, it is possible for measurement radiation to pass to the receiver for reference radiation and for reference radiation to pass to the receiver for measurement radiation. This crosstalk considerably reduces the measurement accuracy. The crosstalk can be all the more intensive, the closer together the receivers for reference radiation and measurement radiation are arranged.

SUMMARY

Therefore, there may be a need for a sensor unit and a distance measuring apparatus which enables good optical isolation of closely adjacent optical paths.

This object can be achieved by means of the subject matter of the present disclosure. Advantageous embodiments of a sensor unit are described herein.

Features, details and possible advantages of a device according to embodiments of the disclosure are discussed in detail below.

In accordance with a first aspect of the disclosure, a sensor unit for detecting reference and measurement radiation for a distance measuring apparatus is presented. The sensor unit comprises a sensor element and an optical shielding device. The sensor element has a first detection region for detecting measurement radiation and a second detection region for detecting reference radiation. The optical shielding device is positioned and fixed with respect to the sensor element and optically isolates the first and second detection regions from one another. The optical shielding device furthermore has a first cutout and a second cutout, which are transmissive to the optical radiation of a first wavelength range.

In this case, the sensor element can be embodied as a chip or chip package. A chip package can have e.g. a semiconductor chip with a frame or a ceramic structure. Furthermore, a chip package can have a chip on a glass plate. The first and second detection regions or the receivers for reference and measurement radiation are arranged close together. By way of example, they are integrated in a common package or monolithically on a material, e.g. a semiconductor material.

The optical shielding device (1) has two cutouts, which are transmissive to the optical radiation in the first wavelength range. Through the cutout, the measurement radiation and the reference radiation can reach the sensor surface at the detection regions provided therefore in the sensor. The first cutout can be provided for the measurement radiation and the second cutout can be provided for the reference radiation. The cutout can constitute an opening. Alternatively, the cutout can have a filter which selectively transmits specific wavelengths or wavelength ranges. The first cutout can be arranged on the optical shielding device and with respect to the sensor element in such a way that optical radiation which passes through the first cutout e.g. perpendicularly impinges on the first detection region. The second cutout can furthermore be arranged in such a way that optical radiation which passes through the second cutout e.g. perpendicularly impinges on the second detection region.

The optical radiation in the first wavelength range can be e.g. visible, infrared or ultraviolet light. The first wavelength range can be e.g. the range of the measurement radiation. The first wavelength range can encompass all wavelengths or approximately ±100 nm around a specific wavelength or alternatively can correspond to exactly one wavelength. By way of example, a semiconductor laser having a wavelength of 635 nm or 650 nm is used.

The optical shielding device can be designed e.g. as a cap composed of plastic above the sensor element. Through the cutouts or openings in the optical shielding device, measurement and reference radiation can impinge on the respective detection regions. The optical shielding device can protect the sensor element e.g. from laterally incident light. Furthermore, the optical shielding device optically isolates the detection regions from one another e.g. by means of a web or a lip.

The sensor element can be fixed to a carrier element such as e.g. a printed circuit board or circuit board. The optical shielding device, which can be arranged above the sensor element, can e.g. likewise be fixed to the carrier element. The fixing can be effected e.g. by means of adhesive bonding or latching. The optical shielding device is fixed with respect to the position of the sensor element on the carrier element. Furthermore, the optical shielding device can be embodied for being oriented and positioned in relation to the sensor element.

To put it another way, the concept of the present disclosure is based on performing an optical isolation between a reference radiation and a measurement radiation on a sensor element. This may be important, in particular, if reference and measurement radiation receivers are integrated on a silicon chip, which necessitates highly positionally accurate isolation over short distances with as far as possible minimal crosstalk.

The integration of the receivers or detection regions for reference and measurement radiation on a sensor element contributes to saving production costs. Furthermore, by virtue of the optical shielding device, despite small distances between reference and measurement radiation detector, an optical isolation can be ensured and the measurement accuracy can thus be increased.

The sensor unit according to the disclosure can be used particularly in the case of packaging technologies which have small tolerances between the securing position of the chip (also designated as "die") and the outer edges of the package.

The optical shielding device can, in terms of its dimensions, for example, be of the order of magnitude of the sensor element, e.g. 2.5×2.5 mm. It can be used e.g. in optical measuring apparatuses, in particular in distance measuring apparatuses.

In accordance with one exemplary embodiment, the optical shielding device has a first bearing surface, which is designed to bring about an orientation of the optical shielding device in a plane parallel to the surface of the sensor element. For this purpose, the first bearing surface can be embodied as a lateral stop surface. The orientation of the optical shielding device enables a precise positioning independently of manufacturing tolerances of further elements such as e.g. the printed circuit board and despite the small dimensions of the individual parts.

In accordance with a further exemplary embodiment, the optical shielding device has a second bearing surface, which is designed to bring about an orientation of the optical shielding device in a plane perpendicular to the surface of the sensor element. The second bearing surface can be a surface parallel to the surface of the sensor element. By way of example, the second bearing surface is embodied on a lip or a web of the optical shielding device between the first and second detection regions. Additionally or alternatively, further second bearing surfaces can be provided at the edges of the optical shielding device. The second bearing surface can bear on the sensor element at the top.

In accordance with a further exemplary embodiment, the optical shielding device has a hard component and a soft component, which are opaque to optical radiation in the first wavelength range. In this case, the soft component is arranged and embodied in a deformable fashion on a sensor-facing side of the optical shielding device.

The hard and soft components can be produced e.g. from different materials having e.g. a different hardness and a different density. The hard component can be designed as a dimensionally stable frame, for example, which has a complementary geometry with respect to the sensor element and can be oriented thereto. The hard component can furthermore be embodied e.g. as less deformable than the soft component.

The soft component can be embodied e.g. as a soft parabolically shaped lip or web, e.g. composed of rubber or similar elastic material. The soft component can be arranged between the first and second detection regions and in this way isolate the optical paths of reference and measurement radiation.

The soft component is deformable under force action, such that, in the assembled state of optical shielding device and sensor element, the optical shielding device is enabled to bear tightly against the surface of the sensor element. For this purpose, the soft component e.g. in a non-deformed state, in a plane perpendicular to the sensor element, can project beyond a second bearing surface of the hard component in the direction toward the sensor element.

The opaqueness of the hard and soft components to optical radiation in a first wavelength range can mean that said components bring about an optical damping. By way of example, the transmission through the hard and soft components is less than 0.1%, in particular less than 0.01% and preferably less than 0.001%, of the incident radiation.

The hard component can have the first and the second bearing surface. The second bearing surface can border the optical shielding device and be embodied as a plane parallel to the surface of the sensor element. Alternatively or additionally, the second bearing surface can be embodied on the soft component.

The soft component can ensure that, despite dimensional and manufacturing tolerances, the optical shielding device lies in a positively locking manner on the sensor element surface and, at the same time, the force input into the sensor element remains limited to a defined amount, or can be minimized. The maximum force input can be set taking account of the above-mentioned tolerances by way of a shore hardness of the soft component. By virtue of the fact that the smoothness of the glass surface is transferred to the soft component, the diffuse scattering of light that is reflected from the chip surface is minimized. Furthermore, a hard component which, as a hard shaped part, for example, ensures the positional accuracy and mechanical stability and is preferably oriented to the sensor element in a positively locking manner contributes to the optical isolation of the sensor element surface.

The design of the optical shielding device is particularly advantageous since, by way of example, manufacturing tolerances can be compensated for by the soft component. Furthermore, a high positional accuracy of the optical shielding device is achieved by the direct orientation of the optical shielding device by means of the bearing surfaces directly on the sensor element. According to a conventional system, significantly higher tolerances have to be taken into account since firstly the manufacturing tolerance of an optical system carrier has to be taken into account. Furthermore, the positional accuracy, e.g. the holes on the printed circuit board, for securing the optical system carrier has to be taken into account. Furthermore, the positional accuracy of the electrical conductor tracks on the printed circuit board and the positional accuracy of the sensor element on the conductor tracks have to be taken into account. By contrast, in the case of the optical shielding device described herein, only the manufacturing tolerances of the optical shielding device have to be taken into account since said device is arranged directly on the sensor element.

In accordance with a further exemplary embodiment of the invention, the soft component and the hard component comprise a material which is absorbent in the first wavelength range. The absorbent material can be a matte black material, for example. The hard component and the soft component can comprise the same absorbent material or different absorbent materials. Furthermore, the hard component and/or the soft component can consist completely of the absorbent material. Alternatively, the hard component and/or soft component can have an absorbent surface coating that reduces the scattering and reflection of the measurement and reference radiation.

Furthermore, the optical shielding device can have a coating that shields against high- or low-frequency electromagnetic radiation e.g. in the high MHz or low GHz range. By way of example, the coating can comprise an electrically conductive material, such as e.g. a conductive metal. As a result, it is possible to prevent electromagnetic compatibility problems (EMC) which can be caused e.g. by the high frequencies occurring in the chip. Additionally, shielding plates can be arranged on the optical shielding device for this purpose.

In accordance with a further exemplary embodiment, the soft component has a first geometrical structure, which is embodied for deflecting stray radiation from a sensor surface. Alternatively or additionally, the hard component has a second geometrical structure which is embodied for deflecting stray radiation from the sensor surface. The first geometrical structure and the second geometrical structure can be embodied identically or differently. Stray radiation can in this case denote, for example, radiation that is not incident perpendicularly on a sensor surface. Furthermore, stray radiation can be reference radiation that is incident on the detector surface provided for detecting measurement radiation. Furthermore, stray radiation can be measurement radiation that is incident on the detector surface provided for detecting reference radiation. The geometrical structure can be a light trap ("beam dump") for example. The first geometrical structure and the second geometrical structure are embodied such that as little stray light as possible is incident on the detection zones of the sensor element surface. For this purpose, the light can be reflected in the geometrical structure such that it leaves the optical shielding device again.

Furthermore, a coating can be applied to the surface of the sensor element, in particular to a glass plate, said coating serving for reducing optical crosstalk within the sensor element between a first and a second detection region. This can be achieved, in particular, by virtue of the fact that the coating has a refractive index of the same order of magnitude as the surface of the sensor element or the coating is embodied as an antireflection coating. By way of example, in the case of a sensor surface composed of glass, a coating having a refractive index of n=1.4 to 1.6, in particular n=1.5, is advantageous. The coating can be embodied as absorbent in a first wavelength range. Alternatively, the material of the soft or hard component can have a refractive index similar to that of the surface of the sensor element. Furthermore, the surface of the sensor element can be structured in order to minimize an optical crosstalk.

In accordance with a further exemplary embodiment, the soft component is embodied integrally with a hard component. By way of example, the two components can be embodied as an injection-molded part, in particular as a two-component injection-molded part (2C mold), possibly composed of plastic. Alternatively, the soft and hard components can consist of two parts that are plugged, adhesively bonded or interlocked, for example.

In accordance with a further exemplary embodiment, the sensor unit furthermore comprises a carrier element, to which the sensor element is fixed. A securing element is furthermore arranged on the optical shielding device, said securing element being designed to engage with the carrier element in such a way that a positively locking connection arises between a surface of the sensor element and the optical shielding device.

In this case, the carrier element is embodied as a printed circuit board or circuit board, for example, on which e.g. the chip is arranged. The securing element can be embodied as a snap-action hook, for example. By way of example, the securing element can be embodied integrally with the hard component. The securing element can interact with a latching element on the carrier element. The interaction of the securing element with a latching element can have the effect that the soft component of the optical shielding device is pressed onto the sensor element surface. For this purpose, the securing element can be embodied in an elastic fashion, for example.

In accordance with a further exemplary embodiment, the optical shielding device has an interface element designed to connect an attachment element to the optical shielding device. The interface element can comprise e.g. a guide and/or a securing means for the attachment element. The attachment element can likewise serve for isolating the measurement and reference radiation. However, the attachment element may have higher manufacturing tolerances, inter alia on account of the greater distance with respect to the sensor element. The attachment element can be secured to the interface element e.g. by adhesive bonding, plugging or a positively locking connection or force-locking connection.

In accordance with one exemplary embodiment, the sensor unit comprises a transmitting device such as e.g. a laser diode for emitting measurement radiation and reference radiation. The transmitting device is arranged directly on the sensor element. That is to say that this transmitting device is situated between the sensor element and the optical shielding device, such that the measurement radiation can leave the sensor unit and can return to it through a cutout in the optical shielding device. The reference radiation can run along a reference section within the sensor unit and e.g. without leaving the optical shielding device, impinge on the second detection region of the sensor element.

In accordance with a second aspect of the present disclosure, a description is given of a distance measuring apparatus for determining a distance, comprising the shielding device described above.

BRIEF DESCRIPTION OF THE DRAWINGS

Further features and advantages of the present disclosure will become apparent to the person skilled in the art from the following description of exemplary embodiments, which, however, should not be interpreted as restricting the disclosure, with reference to the accompanying drawings.

FIG. 1 shows a lateral cross section through a sensor unit in accordance with one exemplary embodiment;

FIG. 2 shows a lateral cross section through an optical shielding device in accordance with one exemplary embodiment of the invention;

FIG. 3 shows a lateral cross section through a sensor unit with additional soft components;

FIG. 4 shows a lateral cross section through an optical shielding device with an absorbent coating and absorbent geometrical structures;

FIG. 7 shows a plan view of an optical shielding device on a printed circuit board;

FIG. 8 shows a lateral cross section through a sensor unit with an interface element;

FIG. 9 shows, in a lateral cross section through a sensor unit, the mechanical fixing of the optical shielding device by means of snap-action hooks;

FIG. 10 shows, in a lateral cross section through a sensor unit, the mechanical fixing of the optical shielding device by means of adhesive bonding;

FIG. 12 shows a lateral cross section through a sensor unit with a transmitting device arranged on the printed circuit board; and FIG. 13 shows a lateral cross section through a sensor unit with a transmitting device arranged between sensor element and optical shielding device.

DETAILED DESCRIPTION

Figure 5A:
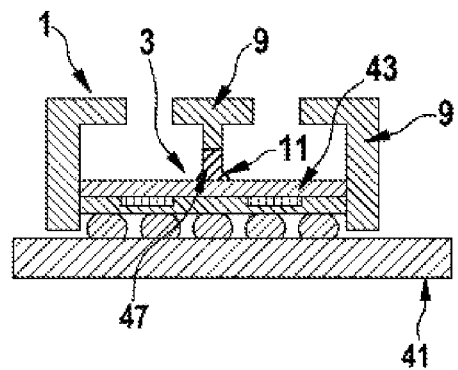
FIG. 5 shows, in a lateral cross section, the alignment of the optical shielding device in relation to the sensor element in the z-direction.

All of the figures are merely schematic illustrations of devices according to the disclosure or of their constituent parts in accordance with exemplary embodiments of the disclosure. Distances and size relations, in particular, are not reproduced in a manner true to scale in the figures. In the various figures, corresponding elements are provided with the same reference numerals.

Figure 11D:
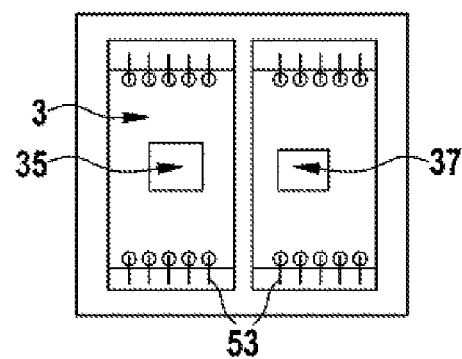
FIG. 11 shows possible designs of the sensor element.
Figure 11E:
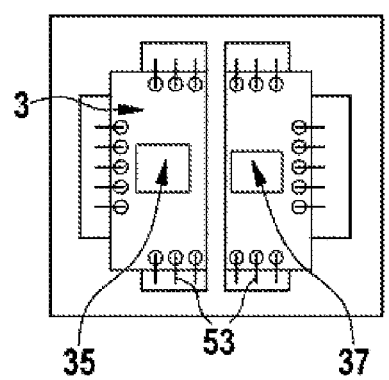

FIG. 1 schematically illustrates a lateral cross section through a sensor unit 33. The sensor unit 33 comprises a sensor element 3 and an optical shielding device 1. The sensor element 3 can be e.g. a chip arranged on a carrier element 41 such as a printed circuit board 41, for example, with a first detection region 35 for measurement radiation 5 and a second detection region 37 for reference radiation 7. The sensor element 3 can furthermore be a chip package with a glass plate 43 covering the chip and, in particular, the detection regions 35, 37. The sensor element 3 can be secured to the printed circuit board 41 differently, as illustrated in FIG. 11. As shown in FIG. 11a, the sensor element 3 can have a glass plate 43 and can be soldered onto the printed circuit board 41 by means of soldering points 45 (ball grid array) (chip-on-glass). FIG. 11b shows an embodiment analogous to FIG. 11a without the glass plate 43 (bare die with ball grid array). In FIG. 11c, the sensor element 3 is arranged directly on the printed circuit board 41. FIGS. 11d and e show alternative plan views of the illustration in FIG. 11c. The sensor element 3 can be secured to the printed circuit board 41 with the aid of bonding wires 53. As shown in FIG. 11d, the optical shielding device 1 can be combined with a "bare die", that is to say a semiconductor chip without a housing. The optical shielding device 1 is oriented directly in relation to the sensor element 3 both vertically and laterally and utilizes the printed circuit board 41 for securing. The edges of the hard component 9 which serve for orientation have, if appropriate, cutouts for the bonding wires 53 illustrated in FIGS. 11d and e.

Packaging technologies which hermetically seal and mechanically protect the chip (e.g. in the chip-on-glass embodiment) and at the same time have small tolerances between outer edges and chip position, as illustrated in FIG. 11a, for example, are particularly advantageous. The tolerance chain in the case of conventional chip packages with respect to the optical shielding device 1 according to the disclosure is composed of the manufacturing tolerance of the optical shielding device 1, the tolerance of the sensor element 3 (that is to say of the chip or chip package), which typically corresponds to a mold package composed of ceramic or cost-effective plastic, and the tolerance of the chip positioning within the package.

The optical shielding device 1 is preferably combined with sensor elements 3 which are produced by means of a packaging method at the wafer level. In this case, the dimensional tolerances of the sensor element 3 are intended to be significantly smaller than in the case of a mold method and correspond approximately to the tolerance of sawn dies.

As shown in FIG. 1, the optical shielding device 1 has a soft component 11, embodied e.g. as a soft lip, and a frame-like hard component 9. The soft component 11 bears directly on the sensor element surface 3. By virtue of the soft flexible material, it closes optically tightly and isolates the regions for reference and measurement radiation 7, 5. This can be achieved, for example, as illustrated in FIG. 2, by virtue of the non-deformed soft component projecting beyond the bearing plane on the sensor element surface in the z-direction, that is to say perpendicularly to a plane parallel to the surface of the sensor element 3. The soft component can be realized e.g. as a parabolically shaped rubber lip, such that it forms a defined bearing surface even in the event of deformation. Such a design of the soft component makes it possible to avoid a situation in which, in the event of pressure being exerted, for example, said soft component folds over to one side and assumes a non-defined position on the sensor element surface. Furthermore, the hard component has a first bearing surface 13, which is embodied as a lateral stop and serves for laterally orienting the optical shielding device 1 in relation to the sensor element 3. Furthermore, the optical shielding device 1 has a second bearing surface 14, which serves for orienting the optical shielding device 1 in a plane perpendicular to the surface of the sensor element 3. The second bearing surface 14 can be realized as part of the soft component 11 and/or in the hard component 9. The optical shielding device 1 has a first cutout 16 for measurement radiation 5 and a second cutout 15 for reference radiation 7.

FIG. 2a illustrates the optical shielding device 1. The dashed line represents a possible plane for the position of the surface of the sensor element 3. In FIG. 2b, the optical shielding device 1 is placed onto a sensor element 3, such that a force is exerted on the soft component 11 and the latter deforms. Furthermore, the optical shielding device 1 is oriented in relation to the first bearing surfaces 13 and the second bearing surfaces 14 e.g. at the glass plate 43.

As illustrated in FIG. 3, additional soft elements 11' can be arranged on the optical shielding device 1. Said soft elements can be arranged, for example, as shown in FIG. 3a, between the printed circuit board and the hard component 9 and can bring about an optically tight closure with the printed circuit board 41. Alternatively, as shown in FIG. 3b, additional soft elements 11' can be arranged between the hard component 9 and the sensor element 3 e.g. above the glass plate 43 and can make possible an optical shielding at the sides of the sensor element. In particular, this arrangement can prevent optical crosstalk if the sensor element 3 and a transmitting device 39, that is to say a light source, are arranged alongside one another on the printed circuit board 41. Additionally, the soft elements 11' can support or bring about an orientation of the optical shielding device 1 in the z-direction.

As shown in FIG. 4a, the optical shielding device 1, on the side facing the sensor element, can comprise an absorbent material 17 both at the soft component and at the hard component. Additionally or alternatively, the optical shielding device 1 can have a first geometrical structure 19 of the soft component 11 and/or a second geometrical structure 21 of the hard component 9, which have the effect that stray light 25, such as e.g. light reflected from the sensor element surface 3, is absorbed in a light trap or leaves the optical shielding device 1 again.

Figure 6A:
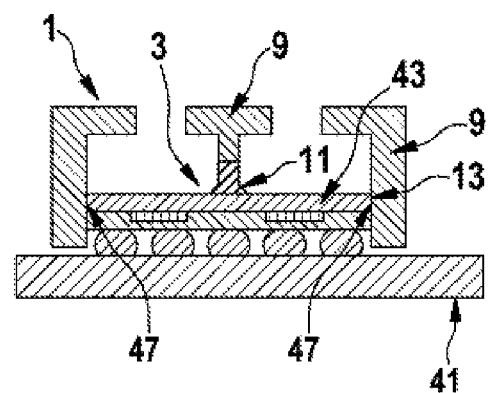
FIG. 6 shows, in a lateral cross section, the alignment of the optical shielding device in relation to the sensor element in the x-y plane.
Figure 6B:
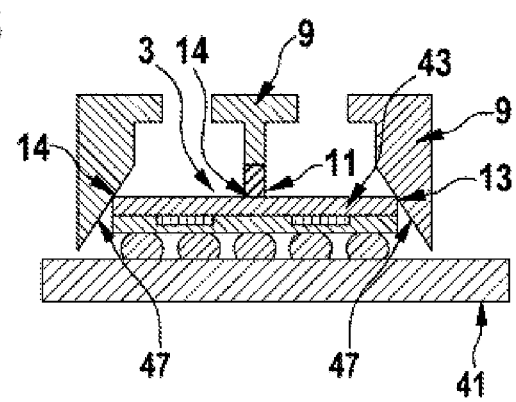
Figure 6C:
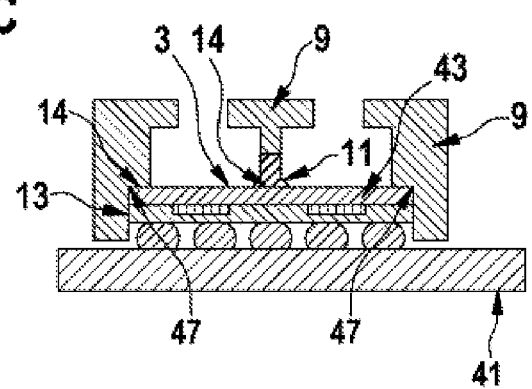

The hard component 9 can be a hard stiff shaped part which ensures the positional accuracy and mechanical stability of the optical shielding device 1. The hard component 9 can be oriented directly in a positively locking manner in the X- and Y-directions, that is to say in the plane parallel to the sensor element surface, in relation to the sensor element 3 or the chip package. The orientation in the XY plane is identified by the reference sign 47 in FIG. 6. As in FIG. 6a, the first bearing surface 13 can be embodied for this purpose as a straight guide of the hard component 9. Alternatively, the guide, as in FIG. 6b, can be embodied in a beveled fashion. In addition, as shown in FIG. 6c, a second bearing surface 14 can support the orientation.

Figure 5B:
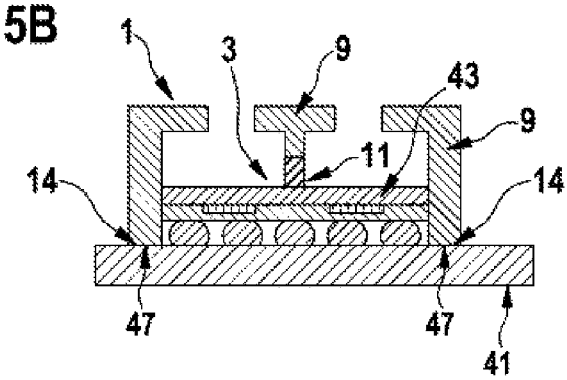
Figure 5C:
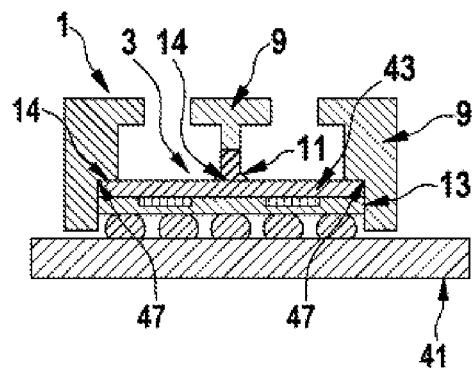

FIG. 5 illustrates the orientation in the Z-direction perpendicular to the sensor element surface. This can be done, as identified by the reference sign 47 in FIG. 5a, with the aid of the second bearing surface of the soft component 11 on the sensor element surface. Alternatively, the orientation 47 can be done as in FIG. 5b in the Z-direction in a positively locking manner with the printed circuit board 41 or as in FIG. 5c by means of the second bearing surface 14 of the hard component on the sensor element surface.

FIG. 7 illustrates a plan view of the optical shielding device 1. The surface of the hard component 9 has a first cutout 16 and a second cutout 15, which are respectively arranged for each side of the optical isolation for the measurement and reference radiation 5, 7. The cutouts 15, 16 can be embodied as open, closed in a transparent fashion, or in an optical filter 23 as in FIG. 8. The respective material of which the hard and soft components 9, 11 consist can have a high absorption coefficient in particular in the wavelength range transmitted by the optical incidence filter 23. As furthermore illustrated in FIG. 8, the optical shielding device 1 can be connected to attachment elements 31, which likewise serve for isolating reference and measurement radiation 7, 5. For this purpose, an interface element 29, e.g. embodied as an adaptor, can be provided at a top side of the optical shielding device 1 and allows a connection, e.g. adhesive bonding or plugging, with tolerances that are significantly above the required positioning accuracy of the soft component 11 on the chip.

The mechanical fixing of the optical shielding device 1 is illustrated in FIGS. 9 and 10. The hard component 9 can be secured, for example, as shown in FIG. 10, to the carrier element 41 and the sensor element 3 by means of adhesive bonding 51. The adhesive 51 in can be optically opaque similarly to the soft component 11' in FIG. 3A and in the same way prevent the incidence of stray light.

FIG. 9 illustrates the fixing by means of securing elements 27 embodied as snap-action hooks. The latter, by virtue of their spring effect, make it possible for the optical shielding device 1 to bear with optimized contact pressure on the sensor element 3 and thus bring about a positively locking connection of the sensor element surface to the soft component 11. The force on the sensor surface is represented by the reference sign 49. Owing to the typical material thicknesses of plastic parts and typical dimensions of securing elements 27, which can be embodied e.g. as snap-action hooks, adhesive bonds, hot caulking elements and ultrasonic welds, securing or fixing to the chip-carrying element, that is to say e.g. to the printed circuit board 41, may be recommendable. As a result of the orientation of the shielding device 1 directly at the sensor element 3, high dimensional tolerances of the printed circuit board 41 are not transferred.

FIGS. 12 and 13 illustrate sensor units 33 having both adhesive bonds 51 and securing elements 27. In FIG. 12, a transmitting device 39 embodied as a laser diode is arranged alongside the sensor unit 33 on the printed circuit board 41. In FIG. 13, the light source 39 is integrated into the sensor unit 33. Measurement radiation 5 can leave the sensor unit 33 through the second cutout 15 and reach the first detection region 35 of the sensor element 3 through the first cutout 16. The reference radiation 7 can run along a sensor-unit-internal reference section 55 by virtue of the fact that it is deflected e.g. by the sensor-element-facing side of the hard component 9 onto the second detection region 37 of the sensor element 3 e.g. by reflection.

Finally, it is noted that expressions such as "comprising" or the like are not intended to preclude the fact that further elements or steps can be provided. Furthermore, it should be pointed out that "a" or "one" does not preclude a plurality. Moreover, features described in conjunction with the different embodiments can be combined arbitrarily with one another. It is furthermore noted that the reference signs in the claims should not be interpreted as restricting the scope of the claims.

The invention claimed is:

1. A sensor unit for detecting reference and measurement radiation for a distance measuring apparatus, the sensor unit comprising:
    a sensor element having a planar sensor surface;
    an optical shielding device,
    wherein the sensor element has a first detection region under the sensor surface for detecting measurement radiation and a second detection region under the sensor surface for detecting reference radiation,
    wherein the optical shielding device optically isolates the first and second detection regions from one another,
    wherein the optical shielding device is positioned and fixed with respect to the sensor element,
    wherein the optical shielding device includes a first cutout and a second cutout, which are transmissive to optical radiation in a first wavelength range,
    wherein the optical shielding device includes (i) a first bearing surface that engages a lateral surface of the sensor element so as to orient the optical shielding device laterally with respect to the sensor element and (ii) a second bearing surface that orients the optical shielding device vertically with respect to the sensor element,
    wherein the optical shielding device is opaque to optical radiation in the first wavelength range,
    wherein:
        the optical shielding device includes a hard component and a soft component,
        the hard and soft components are opaque to optical radiation in the first wavelength range, and
        the soft component is arranged and embodied in a deformable fashion on a sensor-facing side of the optical shielding device, and
        the soft component is positioned in engagement with the sensor surface.

2. The sensor unit as claimed in claim 1, wherein the first bearing surface is configured to orient the optical shielding device in a plane parallel to the sensor surface of the sensor element.

3. The sensor unit as claimed in claim 1, wherein the second bearing surface is configured to orient the optical shielding device in a plane perpendicular to the sensor surface of the sensor element.

4. The sensor unit as claimed in claim 1, wherein the soft component, in a non-deformed state, projects beyond a second bearing surface of the hard component in a direction toward the sensor element, the direction being perpendicular to a plane that is parallel to the sensor surface.

5. The sensor unit as claimed in claim 1, wherein:
    the soft component comprises a material which is absorbent in the first wavelength range, and
    the hard component comprises a material which is absorbent in the first wavelength range.

6. The sensor unit as claimed in claim 1, wherein:
    the soft component defines a first geometrical structure configured to deflect stray radiation from a sensor surface, and
    the hard component defines a second geometrical structure configured to deflect stray radiation from the sensor surface.

7. The sensor unit as claimed in claim 1, wherein the soft component is embodied integrally with the hard component.

8. The sensor unit as claimed in claim 1, further comprising:
    a carrier element,
    wherein the sensor element is fixed to the carrier element,
    wherein a securing element is arranged on the optical shielding device, and
    wherein the securing element is configured to engage with the carrier element to define a positively locking connection between the sensor surface of the sensor element and the optical shielding device.

9. The sensor unit as claimed in claim 1, further comprising:
    an interface element configured to connect an attachment element to the optical shielding device.

10. The sensor unit as claimed in claim 1, further comprising:
    a transmitting device configured to emit measurement radiation and reference radiation,
    wherein the transmitting device is arranged within the sensor unit.

11. A sensor unit for detecting reference and measurement radiation for a distance measuring apparatus, the sensor unit comprising:

a sensor element having a planar sensor surface;
an optical shielding device,
wherein the sensor element has a first detection region under the sensor surface for detecting measurement radiation and a second detection region under the sensor surface for detecting reference radiation,
wherein the optical shielding device optically isolates the first and second detection regions from one another,
wherein the optical shielding device is positioned and fixed with respect to the sensor element,
wherein the optical shielding device includes a first cutout and a second cutout, which are transmissive to optical radiation in a first wavelength range,
wherein the optical shielding device includes a hard component and a soft component, the hard and soft components being opaque to optical radiation in the first wavelength range, and
wherein the soft component is arranged and embodied in a deformable fashion on a sensor-facing side of the optical shielding device and is positioned in engagement with the sensor surface.

12. A sensor unit for detecting reference and measurement radiation for a distance measuring apparatus, the sensor unit comprising:
a sensor element having a planar sensor surface;
an optical shielding device; and
a carrier element,
wherein the sensor element has a first detection region under the sensor surface for detecting measurement radiation and a second detection region under the sensor surface for detecting reference radiation,
wherein the optical shielding device optically isolates the first and second detection regions from one another,
wherein the optical shielding device is positioned and fixed with respect to the sensor element,
wherein the optical shielding device includes a first cutout and a second cutout, which are transmissive to optical radiation in a first wavelength range,
wherein the optical shielding device includes (i) a first bearing surface that engages a lateral surface of the sensor element so as to orient the optical shielding device laterally with respect to the sensor element and (ii) a second bearing surface that orients the optical shielding device vertically with respect to the sensor element,
wherein the optical shielding device is opaque to optical radiation in the first wavelength range,
wherein the sensor element is fixed to the carrier element,
wherein a securing element is arranged on the optical shielding device, and
wherein the securing element is configured to engage with the carrier element to define a positively locking connection between the sensor surface of the sensor element and the optical shielding device.

13. A sensor unit for detecting reference and measurement radiation for a distance measuring apparatus, the sensor unit comprising:
a sensor element having a planar sensor surface;
an optical shielding device; and
a transmitting device configured to emit measurement radiation and reference radiation,
wherein the sensor element has a first detection region under the sensor surface for detecting measurement radiation and a second detection region under the sensor surface for detecting reference radiation,
wherein the optical shielding device optically isolates the first and second detection regions from one another,
wherein the optical shielding device is positioned and fixed with respect to the sensor element,
wherein the optical shielding device includes a first cutout and a second cutout, which are transmissive to optical radiation in a first wavelength range,
wherein the optical shielding device includes (i) a first bearing surface that engages a lateral surface of the sensor element so as to orient the optical shielding device laterally with respect to the sensor element and (ii) a second bearing surface that orients the optical shielding device vertically with respect to the sensor element,
wherein the optical shielding device is opaque to optical radiation in the first wavelength range, and
wherein the transmitting device is arranged within the sensor unit.

* * * * *